United States Patent
Hetzer et al.

(10) Patent No.: US 7,568,949 B2
(45) Date of Patent: Aug. 4, 2009

(54) CONNECTING SOCKET FOR A DATA NETWORK

(75) Inventors: Ulrich Hetzer, Berlin (DE); Frank Mossner, Berlin (DE); Ferenc Nad, Berlin (DE); Sabine Zimmer, Berlin (DE)

(73) Assignee: ADC GmbH, Berlin (DE)

( * ) Notice: Subject to any disclaimer, the term of this patent is extended or adjusted under 35 U.S.C. 154(b) by 0 days.

(21) Appl. No.: 12/104,094

(22) Filed: Apr. 16, 2008

(65) Prior Publication Data

US 2008/0194145 A1    Aug. 14, 2008

Related U.S. Application Data

(63) Continuation of application No. 11/370,573, filed on Mar. 8, 2006, now Pat. No. 7,387,533.

(51) Int. Cl.
*H01R 13/648* (2006.01)

(52) U.S. Cl. .................................... 439/607; 439/931

(58) Field of Classification Search ............. 439/607, 439/931, 608–610, 460–469, 472
See application file for complete search history.

(56) References Cited

U.S. PATENT DOCUMENTS

| | | | |
|---|---|---|---|
| 5,588,871 A | 12/1996 | Salvaneschi | |
| 5,762,518 A | 6/1998 | Tanigawa et al. | |
| 5,957,720 A | 9/1999 | Boudin | |
| 6,077,122 A | 6/2000 | Elkhatib et al. | |
| 6,159,048 A | 12/2000 | Van Koetsem et al. | |
| 6,238,236 B1 | 5/2001 | Craft, Jr. | |
| 6,287,149 B1 | 9/2001 | Elkhatib et al. | |
| 6,375,507 B1 | 4/2002 | Van Koetsem et al. | |
| 6,780,054 B2 * | 8/2004 | Yip et al. | 439/607 |
| 6,848,973 B2 | 2/2005 | Machado et al. | |
| 6,890,213 B2 | 5/2005 | Ohtsuki | |
| 6,905,368 B2 | 6/2005 | Mashiyama et al. | |
| 6,953,362 B2 | 10/2005 | Mossner | |
| 7,025,621 B2 | 4/2006 | Mossner et al. | |
| 7,033,219 B2 | 4/2006 | Gordon et al. | |
| 7,377,818 B2 | 5/2008 | Hetzer et al. | |
| 2001/0046812 A1 | 11/2001 | Fonteneau et al. | |
| 2003/0171024 A1 | 9/2003 | Mossner et al. | |
| 2005/0277335 A1 | 12/2005 | Gordon et al. | |

(Continued)

FOREIGN PATENT DOCUMENTS

DE     196 04 564     3/1997

(Continued)

OTHER PUBLICATIONS

Exhibit A: Notice of Allowance, mailed Jul. 25, 2007 in co-pending U.S. Appl. No. 11/370,608, filed Mar. 8, 2006, which has an overlapping disclosure with the pending case.

(Continued)

*Primary Examiner*—Gary F. Paumen
(74) *Attorney, Agent, or Firm*—Merchant & Gould P.C.

(57) ABSTRACT

The invention relates to a connecting socket (1) for a data network, comprising a housing (2) and at least one female connector (53), the housing (2) being made of plastic, and the inner surfaces of the housing (2) being at least partially metallized.

14 Claims, 5 Drawing Sheets

U.S. PATENT DOCUMENTS

| | | |
|---|---|---|
| 2006/0003623 A1 | 1/2006 | Mossner et al. |
| 2006/0209509 A1 | 9/2006 | Hetzer et al. |
| 2006/0216993 A1 | 9/2006 | Hetzer et al. |

FOREIGN PATENT DOCUMENTS

| | | |
|---|---|---|
| DE | 694 15 645 | 5/1999 |
| DE | 600 06 916 | 10/2004 |
| EP | 0 653 804 | 12/1998 |
| EP | 1 087 472 | 12/2003 |
| WO | WO 02/15339 | 2/2002 |

OTHER PUBLICATIONS

Exhibit B: Amendment, filed on May 7, 2007 in U.S. Appl. No. 11/370,608.

Exhibit C: Office Action mailed Feb. 9, 2007 in U.S. Appl. No. 11/370,608.

Notice of Allowance from U.S. Appl. No. 12/062,080, mailed Oct. 1, 2008.

* cited by examiner

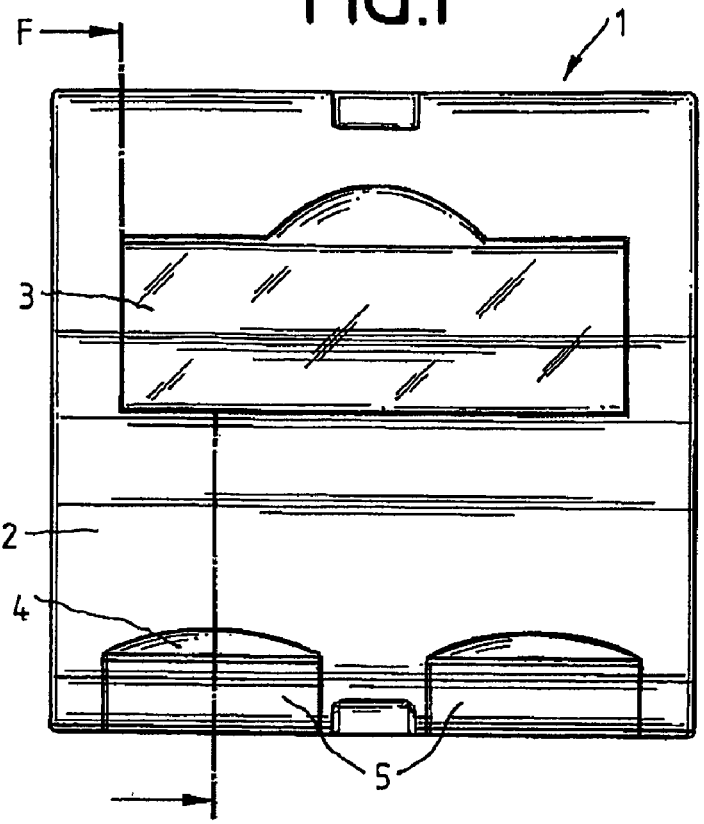
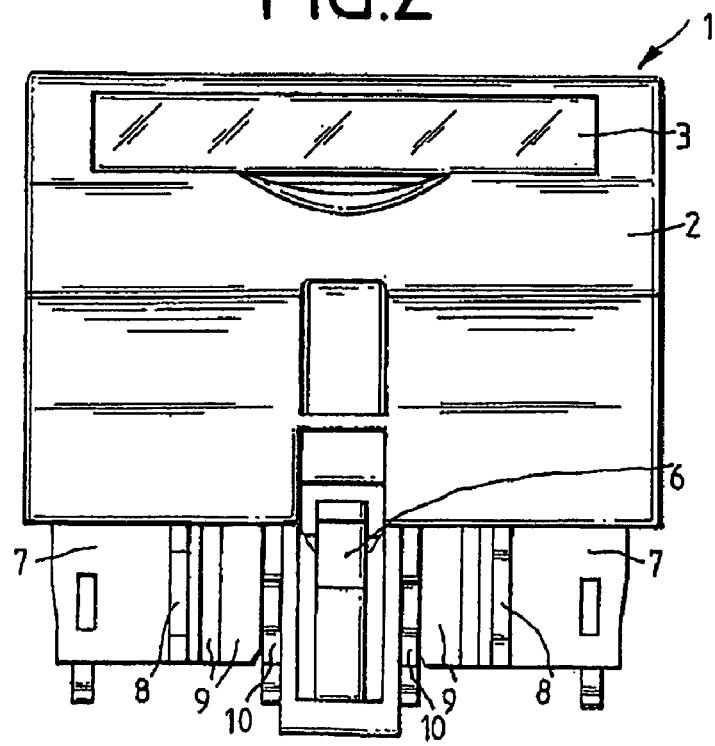

F-F

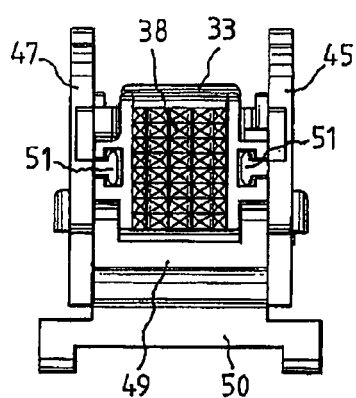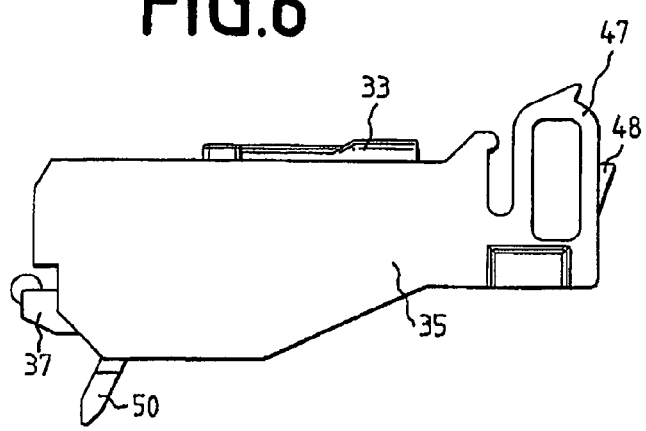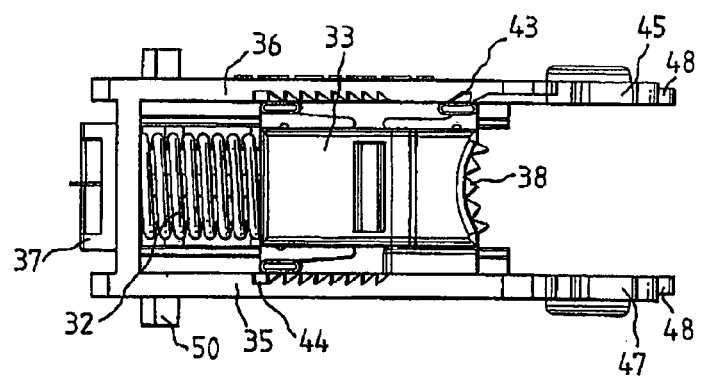

CONNECTING SOCKET FOR A DATA NETWORK

This application is a Continuation of application Ser. No. 11/370,573, filed 8 Mar. 2006 now U.S. Pat. No. 7,387,533, and which application(s) are incorporated herein by reference.

BACKGROUND OF THE INVENTION

The invention relates to a connecting socket for a data network.

Such connecting sockets for telecommunications and data technology generally comprise a plastic housing in which usually one or two female connectors are arranged. In this case, the female connector forms, from the front side, a receptacle for a suitable plug, it being possible for a cable to be connected from the rear side.

DE 196 04 564 C1 discloses a connecting socket for a data network, having a metallic housing lower part, which has a resting surface which is designed to be mounted such that it rests on a wall, having a metallic housing upper part and a printed circuit board which is surrounded by the housing lower part and the housing upper part and which has at least one data plug-in female connector and a plurality of wire connection terminals, to which the individual wires of a multi-core data cable can be connected. In this case, the metallic lower part produces a ground connection to the board, by means of which, for example, the shielding of the cable can then be connected to the housing ground. A covering plastic cap is then pulled over the housing upper part and the housing lower part.

SUMMARY OF THE INVENTION

The invention is based on the technical problem of providing a connecting socket for a data network which is easier to use and produce.

For this purpose, the inner surfaces of the plastic housing are at least partially metallized. As a result, it is possible to dispense with a separate plastic cap, since the plastic housing is not metallized on the outside. As a result, however, at least one part is dispensed with compared to the prior art. One further advantage of the metallized plastic housing is the lower weight and the simplified fixing to covers or the like, in which case it is possible to refer to the known latching connections in plastics technology.

In one preferred embodiment, two female connectors are arranged in the housing, the housing having a wall between the two female connectors which is completely metallized. This metallized wall acts as a shield between the two female connectors and prevents crosstalk from one female connector to the other (alien crosstalk) irrespective of whether the data cable is shielded or unshielded.

In a further preferred embodiment, the wall has a cutout in order to accommodate a latching tab of the female connectors.

In a further preferred embodiment, the female connectors have contact pairs for symmetrical cables, the metallization of the plastic housing being structured such that the capacitive coupling between the contacts of one contact pair is the same size as the metallization. This is based on the knowledge that, owing to asymmetrical, capacitive coupling of the contact pairs with respect to the metallization, asymmetrical coupling-in or coupling-out to ground results, which leads to "alien crosstalk", in particular in the case of high transmission frequencies of Cat 6 or 10 Gbit/s Ethernet. Owing to partial surfaces without metallization, symmetric coupling with respect to the metallization is achieved, since the position of the contact pairs is known in the female connector. It is thus possible for the same housing to be used at the same time for UTP (unshielded twisted pair) or STP (shielded twisted pair) cables and for the required crosstalk values for 10 Gbit/s Ethernet or SGP-Cat 6 to be maintained.

In a further preferred embodiment, the plastic housing is injection-molded from two plastics, preferably the outer plastic being a polycarbonate and the inner plastic being ABS, which can be galvanized considerably more easily than polycarbonate. In this case, the metallization is preferably applied to the plastic by means of galvanization, since the resistance values which can be achieved thereby are lower than by means of vacuum plating or similar methods.

In a further preferred embodiment, a pressure module is inserted from the rear side of the housing.

The pressure module preferably comprises a guide body, a spring and a cable-fixing element, it being possible for the cable-fixing element to be loaded by the spring. In the simplest case, the cable-fixing element acts as a cable strain-relief device and serves the purpose of mechanically latching the inserted female connector.

In a further preferred embodiment, the cable-fixing element is made of metal or metallized plastic. This makes it possible, when using shielded data cables, also to electrically connect a cable shield in a very simple manner, the spring ensuring effective force compensation. As a result, data cables having different diameters can be connected again in a very simple manner.

In a further preferred embodiment, the cable-fixing element has at least one latching tab, and the guide body has at least one latching depression, with the result that the spring can be latched into the guide body with prestress. As a result, the guide body can initially be inserted into the housing in a very simple manner and latched to it. Subsequently, the latching tab can then be pushed out of the latching depression by means of, for example, a tool, such that the cable-fixing element presses, by means of the spring, against the data cable and fixes said data cable.

In a further preferred embodiment, the cable-fixing element has three latching tabs, two latching tabs being arranged laterally on the side which faces the spring, and one latching tab being arranged laterally on the side which faces the cable.

In a further preferred embodiment, the guide body is formed laterally on the inside with a saw-tooth profile. Together with the two rear latching tabs on the cable-fixing element, this profile prevents the cable-fixing element from sliding back and thus the data cable from being bent.

In a further preferred embodiment, the cable-fixing element is formed with a contact lug. The contact lug produces a second electrical connection to the metallization of the housing, which reduces transfer impedance. For this purpose, the contact lug is preferably bent in the direction of the spring.

As regards a preferred embodiment of the female connector, reference is made to WO 02/15339, to the disclosure content of which express reference is hereby made.

BRIEF DESCRIPTION OF THE DRAWINGS

The invention will be explained in more detail below with reference to a preferred exemplary embodiment. In the figures:

FIG. 1 shows a front view of the front side of a connecting socket,

FIG. 2 shows a plan view of the connecting socket,

FIG. 5 shows a plan view of the pressure module, FIG. 6 shows a side view of the pressure module, FIG. 7 shows a front view of the pressure module.

DETAILED DESCRIPTION OF THE PREFERRED EMBODIMENTS

Figure 3:
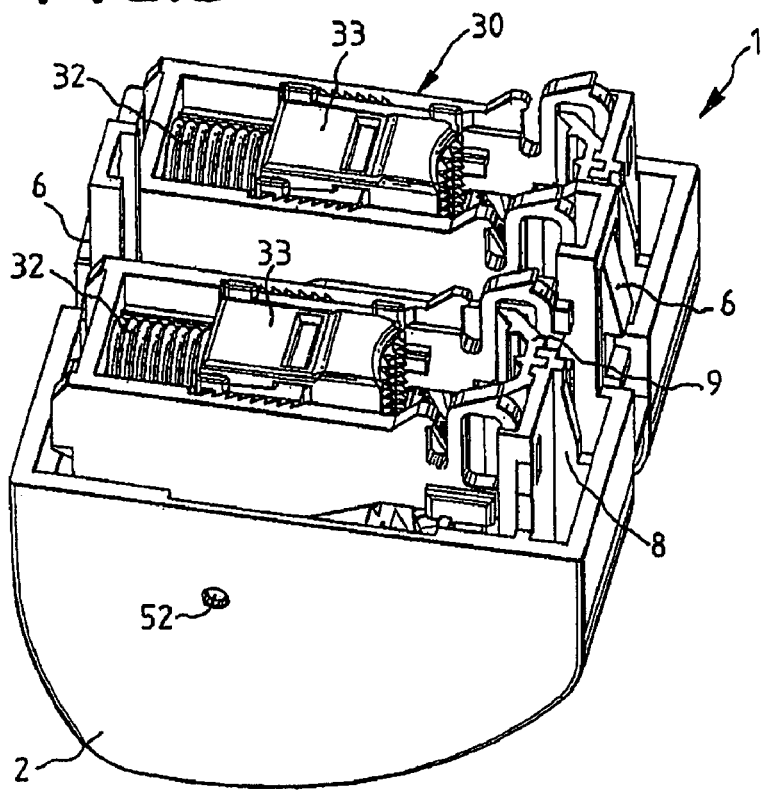
FIG. 3 shows a perspective rear view of the connecting socket with the pressure modules inserted.

FIG. 1 shows a front view of the front side of the plastic housing 2 of the connecting socket 1. A transparent cover 3 for a label can be seen relatively centrally. Concave troughs 4 and flaps 5, by means of which accommodating openings of female connectors for plugs can be closed, can be seen in the lower region. As can further be seen in FIG. 2, the housing 2 comprises a latching clip 6, which serves the purpose of latching the housing 2 to a front frame (not shown). In this case, mention should be made of the fact that a further, hidden latching clip is arranged on the opposite side, as can be seen in FIG. 3. Two plate-shaped elements 7, which each have a slot-shaped aperture in which a latching tab 48 of a latching bracket 45, 47 of a guide body 31 of a pressure module 30 engages (cf. FIG. 6), are arranged laterally at the lower end. Ribs 8 are arranged on the plate-shaped elements 7, it being possible to see the profile of these ribs 8 better in FIG. 3. After a brief horizontal profile, these ribs 8 drop off at an angle and then return to a horizontal profile. The rear side of a concave accommodating element 9, which accommodates the data cable, can be seen next to the plate-shaped element 7. The two concave accommodating elements 9 are each metallized, the rear side, shown in FIG. 2, and the front side as well as the side faces of the accommodating element 9 being metallized and being electrically connected. Two webs 10, between which, in the assembled state, the latching tab 48 of the latching bracket 45 or 47 is located, protrude laterally from the latching clip 6.

FIG. 3 illustrates the rear view of the connecting socket 1 having two pressure modules 30 inserted which are initially explained in more detail with reference to FIGS. 5 to 8. The pressure module 30 comprises a guide body 31, preferably made of plastic, a spring 32 and a cable-fixing element 33. The rear wall 34 and the two side walls 35, 36 of the guide body form an essentially U-shaped structure. An elongate structure is arranged on the rear wall 34, and the spring 32 can be pushed onto said elongate structure. The elongate structure may in this case have a round or cross-shaped cross section. An element 37 which can be hooked into the housing 2 is arranged outside on the rear side of the rear wall 34. The cable-fixing element 33 is formed at the end side in the form of an arc with teeth 38, this arced part forming the mating piece to the accommodating element 9, and the data cable, possibly with a shield, being fixed between said mating piece and the accommodating element 9. Two resilient, bracket-like elements 39, 40 are arranged laterally on the cable-fixing element 33. In this case, the bracket-shaped element 40 extends such that it is fixed in the center both towards the rear side and towards the end side, whereas the bracket-shaped element 39 is passed exclusively to the rear towards the rear side. In each case an elevation 41 is arranged at the resilient ends of the bracket-shaped elements 39, 40, said elevation 41, in particular, making actuation by means of a tool easier. In each case a latching tab 42 is arranged in the region of the elevations 41 at the side walls of the bracket-shaped elements 39, 40. In the prestressed state of the spring, the front latching tab 42 latches into a latching depression 43, and the two rear latching tabs 42 latch into latching depressions 44. This prestressed state is illustrated in FIGS. 5 to 8, the primary support being provided by means of the front latching tab 42. If in this case, owing to pressure on the bracket-shaped element 40 laterally towards the elevation 41, for example by means of a tool, the latching tab 42 is pushed out of the latching depression 43, the spring 32 is released, and the cable-fixing element 31 moves to the front until it hits a data cable or latches in at a latching bracket 45 of the guide body 31. As a result, data cables having different diameters can be fixed securely and reliably, and contact may be made with their shielding. A saw-tooth profile 46 is applied to the inner surface of the side walls 35, 36. When the cable-fixing element advances rapidly, the two rear latching tabs 42 then slide over the profile 46, but this profile 46 prevents them from sliding back. In each case a latching tab 48 is arranged on the latching bracket 45 or 47. In the assembled state (cf. FIG. 3), in this case one latching tab 48 latches into the slot-shaped aperture in the plate-shaped element 7, whereas the other latching tab 48 lies between the two webs 10. A contact lug 49 protrudes from the underside of the cable-fixing element 33, a U-shaped contact element 50 being arranged on said contact lug 49. In the assembled state, the contact element 50 comes to rest on metallized webs of the housing 2 and produces a second electrical contact path between a shielding of a data cable and the metallization of the housing 2. These two electrical paths (via the accommodating element 9 and the contact element 50) considerably improve the transfer impedance. Furthermore, in each case a T-shaped web 51 can be seen in FIGS. 7 and 8 which is arranged on the inner sides of the side walls 35, 36 and acts as a guide rail for the contact-fixing element 33.

As has already been mentioned, the assembled state of the connecting socket (without the data cables) is illustrated in FIG. 3. In this case, an opening 52 can be seen on the side wall of the housing 2. This opening 52 accommodates a latching tab of a female connector, whereas the latching tab corresponding therewith lies on the other side of the female connector in a cutout in a wall between the two female connectors.

Figure 4:
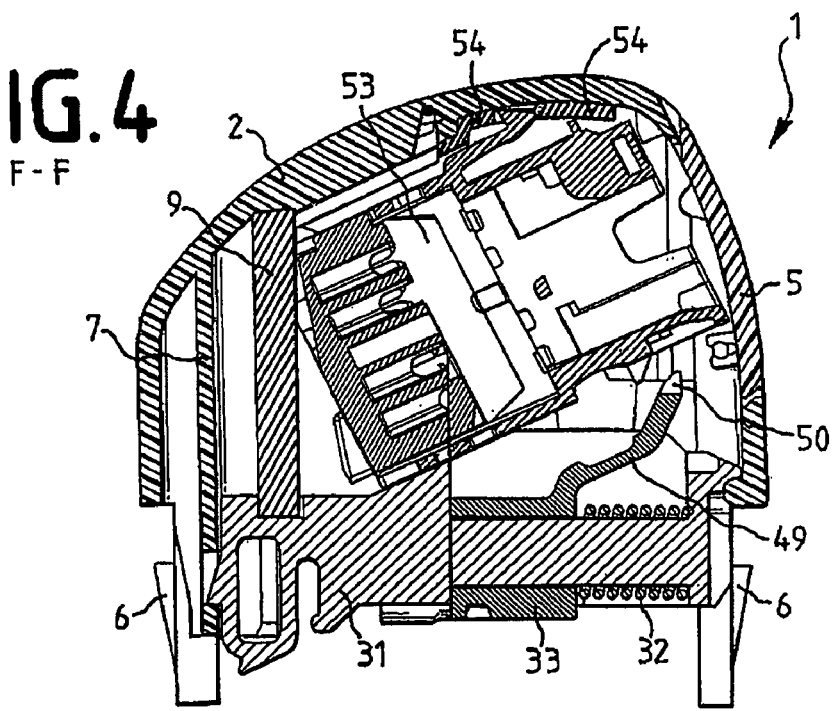
FIG. 4 shows a sectional illustration through the connecting socket along the section line F-F shown in FIG. 1.
Figure 8:
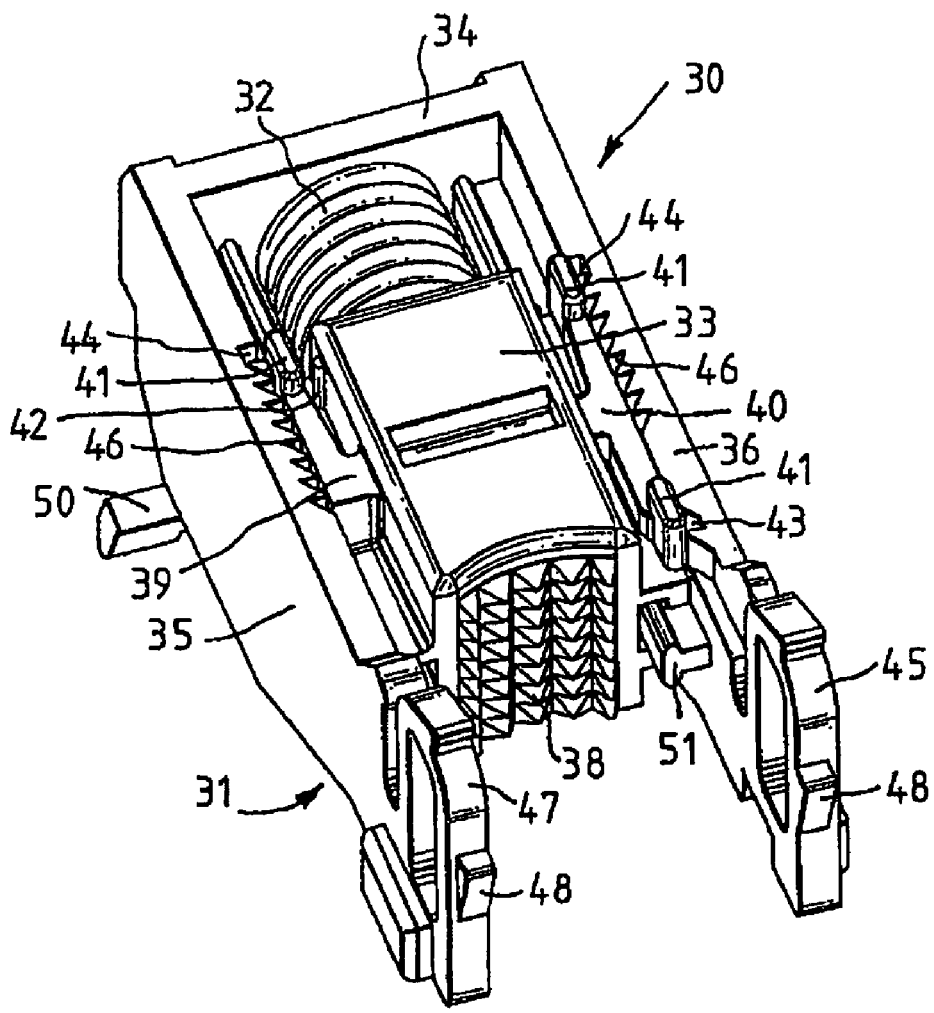
FIG. 8 shows a perspective illustration of the pressure module.

A cross-sectional illustration along the section F-F shown in FIG. 1 is shown in FIG. 4, it being possible to see the position of the female connector 53 in the housing 2. In this case, the metallizations 54, which can be seen in section, of the housing 2 are shown in black.

Figure 9:
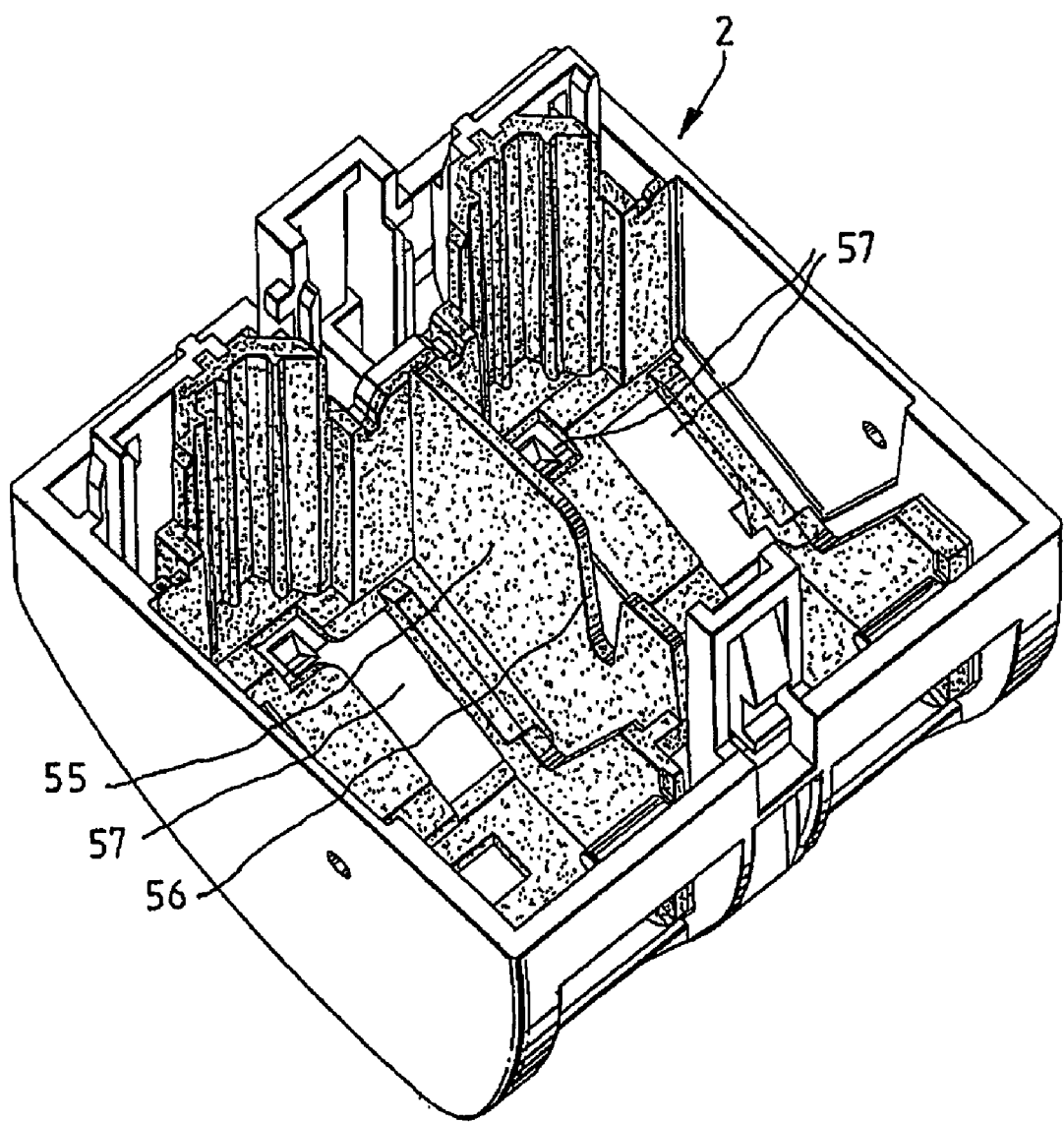
FIG. 9 shows a perspective rear view of the housing without the female connectors and the pressure modules.

Finally, FIG. 9 shows a perspective view of the housing 2 alone, the metallizations 54 being illustrated as punctiform areas. In addition to the metallized receptacles 9, it is possible to see, in particular, the wall 55 with the cutout 56. Furthermore, areas 57 can be seen which are not metallized. In this case, in particular the large areas 57 serve the purpose of matching the capacitive coupling of the contacts of a contact pair to the metallization, i.e. both contacts of a contact pair have virtually the same capacitive coupling.

LIST OF REFERENCE NUMERALS

1 Connecting socket
2 Plastic housing
3 Cover
4 Concave troughs
5 Flaps
6 Latching clip
7 Plate-shaped elements
8 Ribs 9 Concave accommodating element
10 Webs
30 Pressure module
31 Guide body
32 Spring
33 Cable-fixing element
34 Rear wall
35 Side wall
36 Side wall
37 Arced element
38 Teeth
39 Bracket-shaped element
40 Bracket-shaped element
41 Elevation
42 Latching tab
43 Latching depression
44 Latching depression
45 Latching bracket
46 Saw-tooth profile
47 Latching bracket
48 Latching tab
49 Contact lug
50 U-shaped contact element
51 T-shaped webs
52 Opening
53 Female connector
54 Metallizations
55 Wall
56 Cutout
57 Areas

The invention claimed is:

1. A connecting socket for a data network, comprising:
a housing having an outer surface and having an inner surface defining an interior, the housing including a first concave accommodating element, a second concave accommodating element, and a wall positioned between the concave accommodating elements, the concave accommodating elements being configured to accommodate data cables, the outer surface of the housing including exposed plastic and at least a portion of the inner surface including metallized plastic;
a first female connector arranged within the interior of the housing, the first female connector terminating a first data cable that is accommodated by the first concave accommodating element when the first female connected is inserted into the housing; and
a second female connector arranged within the interior of the housing adjacent the first female connector, the second female connector terminating a second data cable that is accommodated by the second concave accommodating element when the second female connector is inserted into the housing.

2. The connecting socket of claim 1, wherein the wall is metallized and extends between the first and second female connectors, the metallized wall inhibiting alien cross-talk between the first and second female connectors.

3. The connecting socket of claim 2, wherein the metallized wall defines a cutout configured to accommodate a latching tab of the first female connector to secure the first female connector within the housing.

4. The connecting socket of claim 1, wherein the inner surface of the housing includes areas that are not metallized.

5. The connecting socket of claim 4, wherein the areas of the inner surface that are not metallized match capacitive coupling of contacts of a contact pair of the first and second female connectors to the metallized plastic portion of the inner surface.

6. The connecting socket of claim 1, wherein the metallized plastic portion of the inner surface is monolithically formed with the housing.

7. The connecting socket of claim 1, wherein the housing is injection-molded from two plastics.

8. The connecting socket of claim 1, wherein the portion of the inner surface is metallized by galvanization.

9. The connecting socket of claim 1, wherein the first accommodating element produces a first electrical contact path between a shielding of the first data cable and the metallized plastic portion of the inner surface of the housing.

10. The connecting socket of claim 9, wherein the first data cable is fixed against the first accommodating element by a cable fixing element, from which a contact element protrudes to rest against metallized webs of the housing to form a second electrical contact path between a shielding of the first data cable and the metallized plastic portion of the inner surface of the housing.

11. A connecting socket for a data network, comprising:
a housing having an outer surface and having an inner surface defining an interior, the outer surface including exposed plastic and at least a portion of the inner surface including metallized plastic;
a first female connector arranged within the interior of the housing; and
a second female connector arranged within the interior of the housing adjacent the first female connector;
wherein the housing includes a metallized wall extending between the first and second female connectors, the metallized wall inhibiting alien cross-talk between the first and second female connectors; and
wherein the metallized wall defines a cutout configured to accommodate a latching tab of the first female connector to secure the first female connector within the housing.

12. A connecting socket for a data network, comprising:
a housing having an outer surface and having an inner surface defining an interior, the outer surface including exposed plastic and at least a portion of the inner surface including metallized plastic;
a first female connector arranged within the interior of the housing; and
a second female connector arranged within the interior of the housing adjacent the first female connector;
wherein the inner surface of the housing includes areas that are not metalized; and
wherein the areas of the inner surface that are not metallized match capacitive coupling of contacts of a contact pair of the first and second female connectors to the metallized plastic portion of the inner surface.

13. A connecting socket for a data network, comprising:
a housing having an outer surface and having an inner surface defining an interior, the outer surface including exposed plastic and at least a portion of the inner surface including metallized plastic;
a first female connector arranged within the interior of the housing; and
a second female connector arranged within the interior of the housing adjacent the first female connector;
wherein the interior of the housing defines a first accommodating element against which a data cable received in the first female connector can be fixed; and
wherein the accommodating element produces a first electrical contact path between a shielding of the data cable and the metallized plastic portion of the inner surface of the housing.

14. A connecting socket for a data network, comprising:
- a housing having an outer surface and having an inner surface defining an interior, the outer surface including exposed plastic and at least a portion of the inner surface including metallized plastic;
- a first female connector arranged within the interior of the housing; and
- a second female connector arranged within the interior of the housing adjacent the first female connector;
- wherein the interior of the housing defines a first accommodating element against which a data cable received in the first female connector can be fixed; and
- wherein the data cable is fixed against the first accommodating element by a cable fixing element, from which a contact element protrudes to rest against metallized webs of the housing to form a second electrical contact path between a shielding of the data cable and the metallized plastic portion of the inner surface of the housing.

* * * * *

UNITED STATES PATENT AND TRADEMARK OFFICE
CERTIFICATE OF CORRECTION

PATENT NO. : 7,568,949 B2 Page 1 of 1
APPLICATION NO. : 12/104094
DATED : August 4, 2009
INVENTOR(S) : Hetzer et al.

It is certified that error appears in the above-identified patent and that said Letters Patent is hereby corrected as shown below:

Title page (30) Foreign Application Priority Data: Insert the omitted foreign priority data --Mar. 9, 2005   (DE)   10 2005 012 369.4-22--

Col. 5, lines 45-46, claim 1: "female connected is inserted" should read --female connector is inserted--

Signed and Sealed this

Twenty-third Day of February, 2010

David J. Kappos
*Director of the United States Patent and Trademark Office*